United States Patent [19]
Phaneuf

[11] Patent Number: 6,163,231
[45] Date of Patent: Dec. 19, 2000

[54] MILLIMETER WAVE MODULATOR AND TRANSMITTER

[75] Inventor: Robert A. Phaneuf, Haverhill, Mass.

[73] Assignee: Omron Corporation, Kyoto, Japan

[21] Appl. No.: 09/394,404

[22] Filed: Sep. 13, 1999

[51] Int. Cl.[7] .............................. H03C 1/14; H04L 27/04
[52] U.S. Cl. ...................... 332/106; 332/163; 332/164; 375/268; 375/300; 455/108
[58] Field of Search ...................... 332/106, 163, 332/164; 375/268, 300; 455/108

[56] References Cited

U.S. PATENT DOCUMENTS 3,852,794  12/1974  Pearson et al. .................. 331/107 DP

*Primary Examiner*—Siegfried H. Grimm
*Attorney, Agent, or Firm*—Dickstein Shapiro Morin & Oshinsky LLP

[57] ABSTRACT

In a millimeter wave modulation of the direct modulation technology, the switching speed is increased and the modulation bandwidth is broadened. A millimeter wave modulator includes a millimeter wave waveguide. a switching element (PIN diode) disposed in the waveguide in which the switching element is turned on and off by a digital signal to achieve amplitude-modulation of a millimeter carrier wave propagating through the waveguide, and a shunt resistor connected to the switching element in parallel.

6 Claims, 8 Drawing Sheets

6,163,231

MILLIMETER WAVE MODULATOR AND TRANSMITTER

BACKGROUND OF THE INVENTION

1. Field of the Invention

The present invention relates to a modulator for directly modulating a millimeter wave and a transmitter including the modulator. In this context, the millimeter wave includes a microwave.

2. Description of the Related Art

Several kinds of millimeter wave modulations have been known. In an up-converting modulation, a carrier is modulated at a low (intermediate) frequency and then the carrier is mixed or up-converted to a high output (transmission) frequency. This method is attended with a problem that the bandwidth is narrowed to attain high fidelity. For example, when the modulation is achieved with an intermediate frequency of 2 GHz to convert the carrier into a transmission frequency of 40 GHz, at most a modulation frequency bandwidth of about 100 MHz is obtained.

In a direct modulation (technique), a high-speed switching element, e.g., a PIN diode is arranged in a waveguide and the switching element is turned on or off by a signal to change impedance of a millimeter wave propagating the waveguide. When the PIN diode is switched at a high frequency, there appear L and C components, which equivalently forms an LC parallel resonance circuit. This resultantly prevents the high-speed switching and the bandwidth is limited to, for example, at most 100 MHz.

SUMMARY OF THE INVENTION

It is therefore an object of the present invention to improve the direct modulation technique and to achieve a high-speed, widening modulation bandwidth.

Another object of the present invention is to achieve a high-speed switching with high reliability at a low cost.

In accordance with the present invention, a millimeter wave modulator includes a millimeter wave waveguide and a switching element disposed in the waveguide in which the switching element is turned on and off by a signal to be transmitted to achieve amplitude-modulation of a millimeter carrier wave propagating through the waveguide. The modulator further includes a resistor connected to the switching element in parallel.

The resistor has a value of resistance to be determined according to a characteristic of the switching element, a switching speed and the like. In general, the resistor has resistance sufficiently greater than resistance of the switching element when the switching element is on, and is sufficiently smaller than the resistance, i.e., input impedance of the switching element when the switching element is off.

A favorable example of the switching element is a PIN diode having a superior switching speed.

In accordance with the present invention, a resistor is connected in parallel with the switching element. Electric charge accumulated in the switching element is discharged via the resistor. Consequently, the value of Q is kept retained at a low value even when the switching element is driven at a high speed. This allows a wide bandwidth for modulation without changing the center frequency, leading to a high modulation speed.

A plurality of switching elements may be connected in parallel with each other if necessary.

A millimeter wave modulation method in accordance with the present invention for use with a modulator including a millimeter wave waveguide and a switching element disposed in the waveguide in which the switching element is turned on and off by a signal to change impedance of a millimeter carrier wave propagating through the waveguide, thereby achieving modulation, includes the step of connecting a resistor to the switching element in parallel to reduce a Q value of a parallel resonance circuit appearing when the switching element is switched at a high speed and to broaden a bandwidth for the modulation.

The present invention further provides a device for performing a high-speed switching operation, which includes a waveguide, a substrate (a printed circuit board) disposed in the waveguide, the substrate being used to arrange a switching element thereon, a conductor pattern fabricated on the substrate for matching impedance in a section of the waveguide between an input side thereof and a position at which the switching element is arranged and in a section of the waveguide between an output side thereof and the position of the switching element, and a resistor connected to the switching element in parallel.

Moreover, in accordance with the present invention, there is provided a millimeter wave transmitter including the above millimeter wave modulator. The transmitter includes an oscillator for generating a millimeter carrier wave, a waveguide for guiding a millimeter wave from the oscillator to an antenna, a switching element disposed in the waveguide, the switching element being turned on and off by a signal, and a shunt resistor connected to the switching element in parallel. Thanks to the shunt resistor, there can be implemented a millimeter wave transmitter having a wide bandwidth for modulation.

BRIEF DESCRIPTION OF THE DRAWINGS

The objects and features of the present invention will become more apparent from the consideration of the following detailed description taken in conjunction with the accompanying drawings in which:

FIG. 5 is a diagram showing an equivalent circuit of the millimeter wave modulator when a PIN diode is on;

DESCRIPTION OF THE PREFERRED EMBODIMENTS

Referring now to the accompanying drawings, description will be given of an embodiment in accordance with the present invention.

Figure 1:
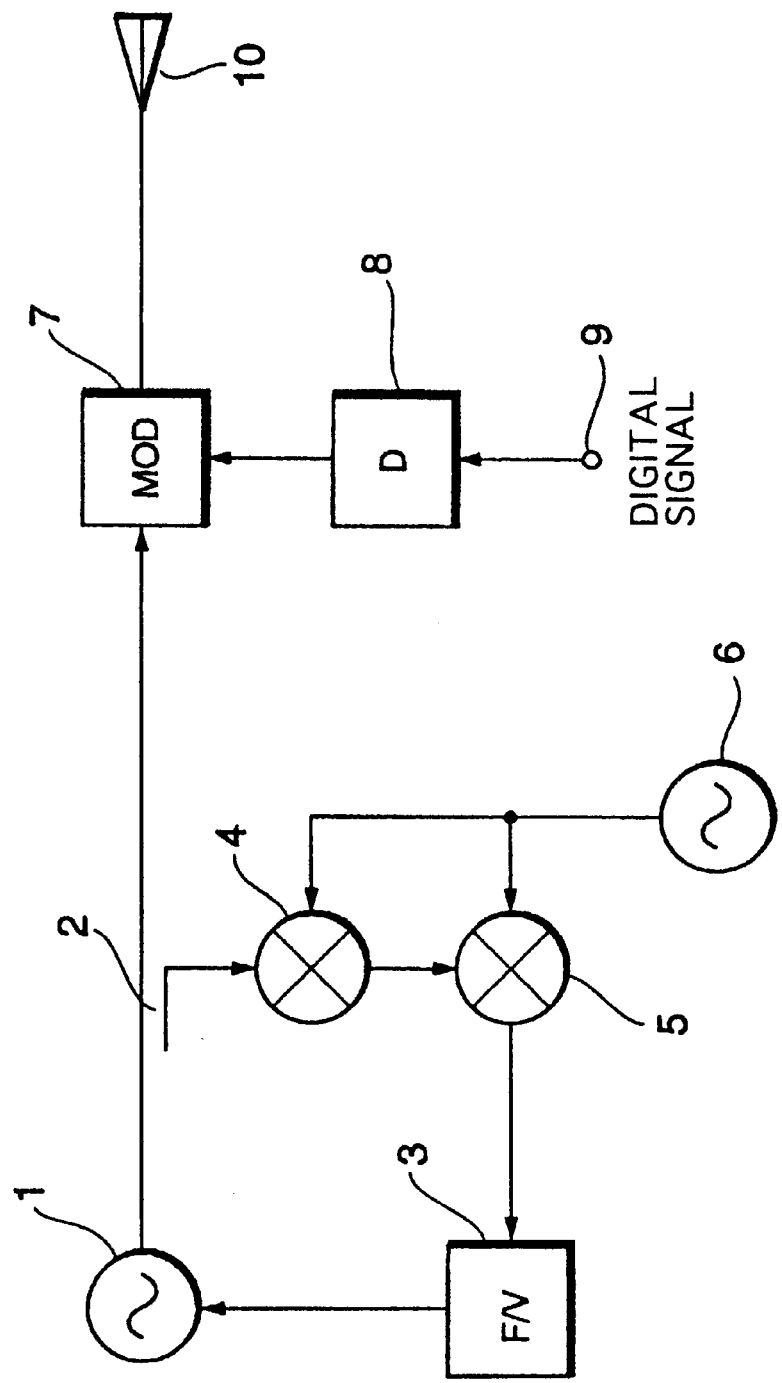
FIG. 1 is a block diagram showing an electric configuration of an embodiment of a millimeter wave transmitter.

FIG. 1 shows in a block diagram a circuit of a millimeter wave transmitter.

In FIG. 1, a voltage controlled oscillator 1 generates a carrier wave of a millimeter band (including a microwave band). In operation, the oscillator 1 has a center frequency of 60 GHz, for example. The carrier is fed via a power splitter 2 to a millimeter wave modulator 7. In the power splitter 2, part of the carrier is separated to be delivered to a down-converter 4.

The down-converter 4 is, for example, a harmonic mixer to convert a carrier into a signal having a lower frequency. In the down-converter 4, a 60 GHz carrier is down-converted into, for example, a 1.9 GHz signal.

In the transmitter circuit, a reference signal oscillator 6 includes a crystal oscillator to generate a signal of a stable frequency. The oscillator 6 generates an oscillation signal at 1.9 GHz, for example.

Signals respectively from the down-converter 4 and the oscillator 6 are fed to a mixer 5 to be compared with each other therein so as to produce a differential signal therebetween. The differential signal is supplied to a frequency-to-voltage (F/V) converter 3.

The converter 3 generates a voltage signal in accordance with a frequency of the differential signal. The voltage signal is delivered to an oscillator 1 to control an oscillation frequency thereof. The oscillator 1 resultantly generates a millimeter carrier wave with a stable fixed frequency, e.g., 60 GHz. The carrier from the oscillator 1 is fed via the power splitter 2 to the modulator 7 to be modulated therein. The modulated signal is radiated to the air via an antenna 10.

A signal (in a digital signal form in general) to be transmitted is fed via a terminal 9 to a driver circuit 8 having a waveform shaping and a current amplifying function. The driver 8 drives, in response to a digital signal inputted thereto, a switching element (a PIN diode which will be described later) included in the modulator 7. In a favorable configuration, the driver 8 has a low output impedance to achieve a high-speed switching operation.

There is formed a waveguide to propagate the millimeter carrier wave from the oscillator 1 to the antenna 10. The modulator 7 is arranged to form a part of the waveguide. The antenna 10 includes commonly known various types, i.e., a patch array antenna, a parabola antenna, and a Cassegrain reflector antenna.

Figure 2:
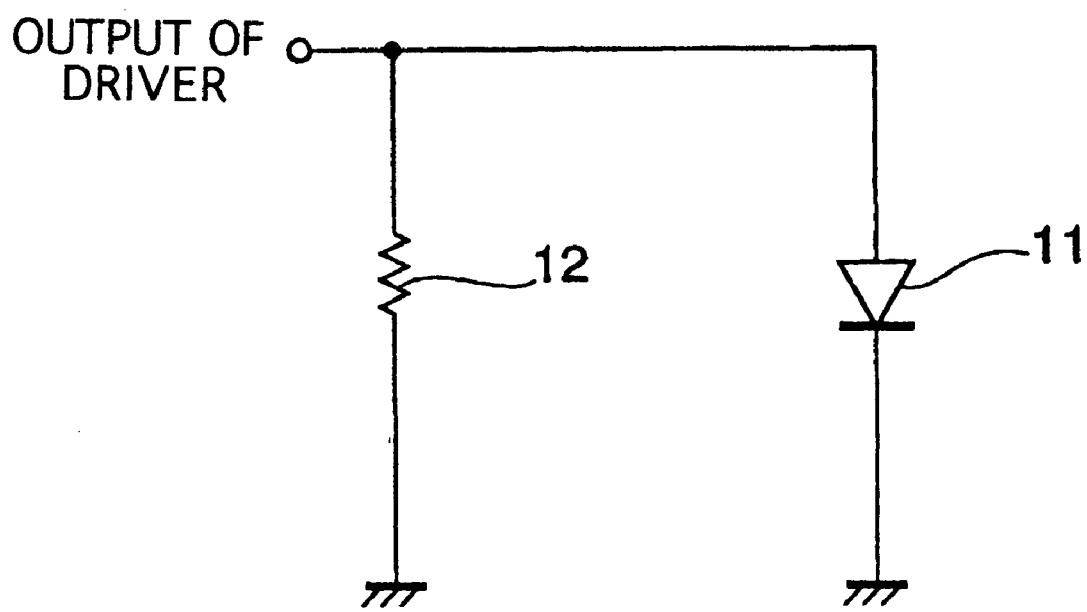
FIG. 2 is a circuit diagram showing an electric constitution of an embodiment of a millimeter wave modulator.

FIG. 2 shows a circuit diagram of the modulator 7, which includes a PIN diode 11 to conduct a high-speed switching operation. The PIN diode 11 includes a cathode grounded (or connected to a negative side) and an anode biased by the driver circuit 8. The driver 8 outputs a driving signal, i.e., a rectangular waveform signal (a digital signal) having a waveform shaped. When forwardly biased by the driving signal, the PIN diode 11 is on; when reversely biased, the PIN diode 11 is off.

Connected in parallel with the PIN diode 11 is a shunt resistor 12 having a low resistance value. The resistor 12 lowers the value of a quality factor (Q) of a parallel resonance circuit appearing when the PIN diode 11 is driven at a high speed, and hence the modulation bandwidth is broadened, which will be described later. Therefore, the resistor 12 may be called a band enhance resistor (BER) or a bandwidth widening resistor (BWR).

Figure 3:
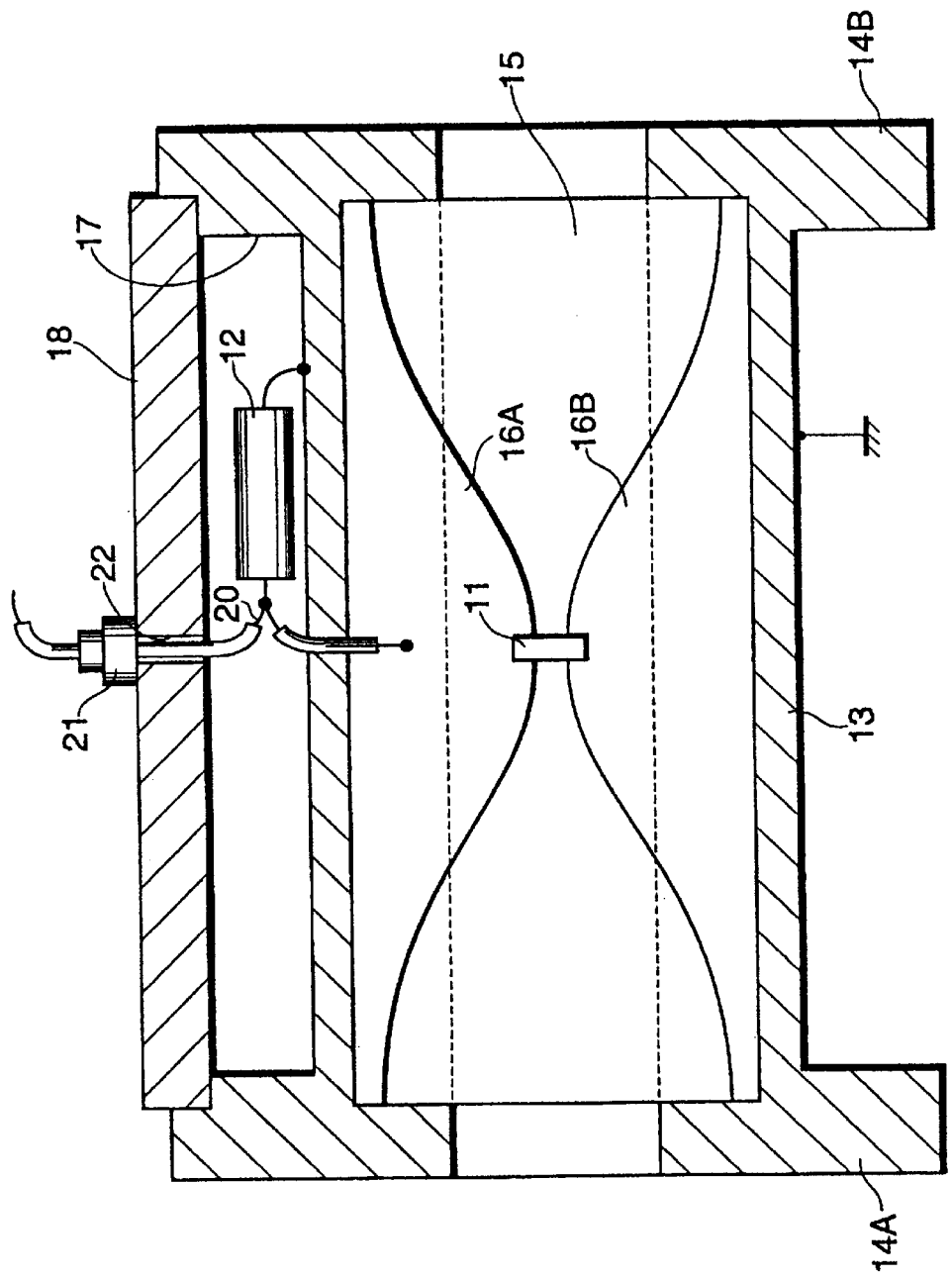
FIG. 3 is a longitudinal cross-sectional view of the millimeter wave modulator.
Figure 4:
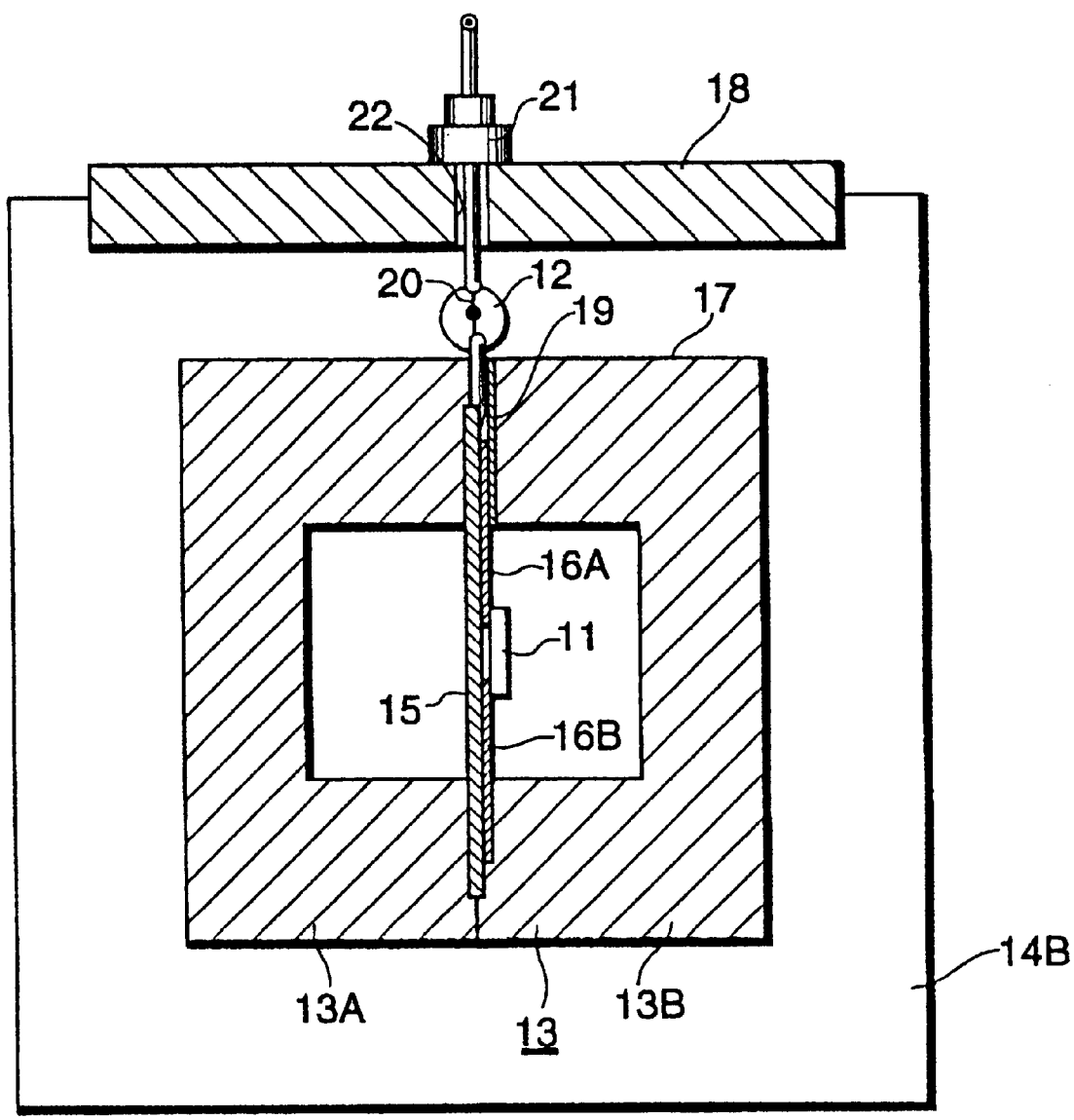
FIG. 4 is a lateral cross-sectional view of the millimeter wave modulator.

FIGS. 3 and 4 show a concrete configuration of the modulator 7.

Arranged at both ends of a waveguide 13 are flanges 14A and 14B, respectively. The waveguide 13 is formed with a recess 17 on an upper outside surface thereof between the flanges 14A and 14B. The recess 17 has two sides opened and is covered with a plate (cover) 18.

The waveguide 13 comprises left-and-right halfbodies 13A and 13B between which a substrate (a printed circuit board, an insulator) 15 is sandwiched. At the center of the waveguide 13, the substrate 15 extends from the flange 14A to the flange 14B.

The substrate 15 is formed with conductor patterns (metallic films of, for example, gold) 16A and 16B on a surface thereof at its upper side and lower side. Each of the patterns 16A and 16B has a width which smoothly increases from both end edges to a center of the substrate 15. The conductor patterns 16A and 16B are electrically insulated from each other. At a central region where the patterns 16A and 16B are nearest to each other, there is arranged a PIN diode 11 having an anode and a cathode electrically connected to the patterns 16A and 16B, respectively.

The conductive patterns 16A and 16B are employed to match impedance in a section of the waveguide 13 between the flange 14A and the PIN diode 11 and in a section of the waveguide 13 between the flange 14B and the PIN diode 11. The patterns 16A and 16B are therefore called "impedance matching tapers".

The waveguide 13 is grounded, and the conductor pattern 16B made contact with the waveguide 13 is also grounded. The conductor pattern 16A is brought into contact with an insulator film 19 fabricated on a junction surface of the halfbody 13B of waveguide 13 and is hence electrically insulated from the waveguide 13. Disposed in the depression 17 is a shunt resistor 12 having an end connected to the waveguide 13. The resistor 12 has another end which is connected via a wire 20 to the corductor pattern 16A. The wire 20 is passed through a hole 22 of the cover 18 in an insulated state while being fixed by a fixing unit (feed through) 21 to be led outside of the waveguide 13. The wire 20 is coupled with an output side of the driver circuit 8. It is to be understood that the circuit structure of FIG. 2 is electrically equivalent to the configurations shown in FIGS. 3 and 4.

The shunt resistor 12 functions as follows.

Figure 5:
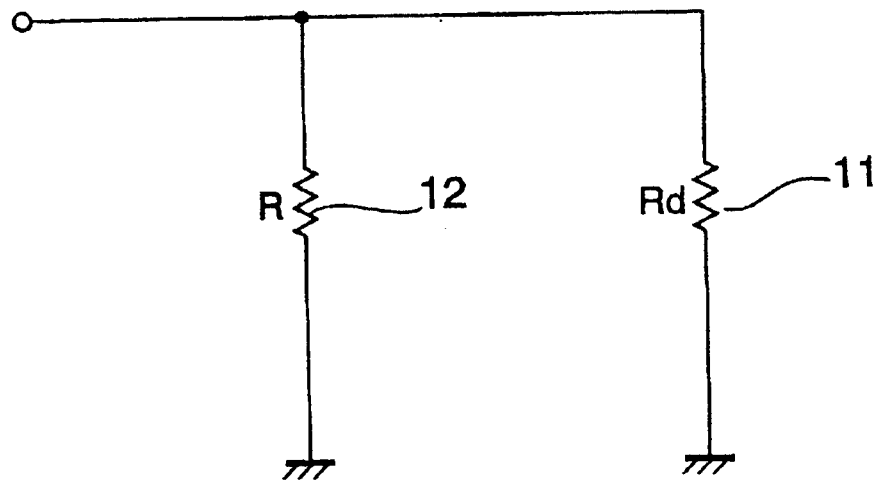
Figure 6:
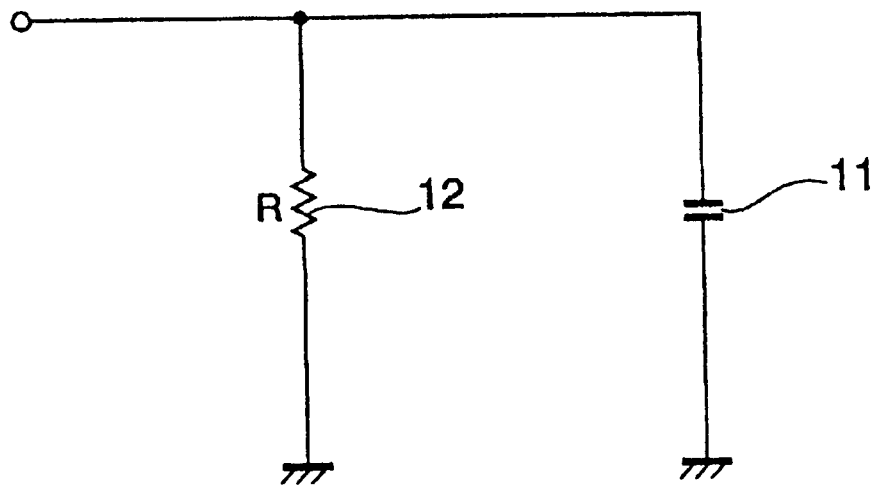
FIG. 6 is a diagram showing an equivalent circuit of the millimeter wave modulator when a PIN diode is off.

FIGS. 5 and 6 respectively show equivalent circuits when the PIN diode 11 is on and off, respectively. To transmit the carrier with a very low loss through the modulator 7, the shunt resistor 12 is required to have a resistance value R which is sufficiently higher than a forward resistance value Rd of the PIN diode 11 attained when the PIN diode 11 is on (R>>Rd). When the PIN diode 11 is off, it is necessary to quickly discharge electric charge accumulated in the PIN diode 11. Consequently, the resistance R of the shunt resistor 12 is required to be sufficiently lower than the input impedance (resistance) of the PIN diode obtained when the PIN diode 11 is off.

The shunt resistor 12 discharges electric charge remaining in the PIN diode 11 being turned on and off at a high speed.

Figure 7:
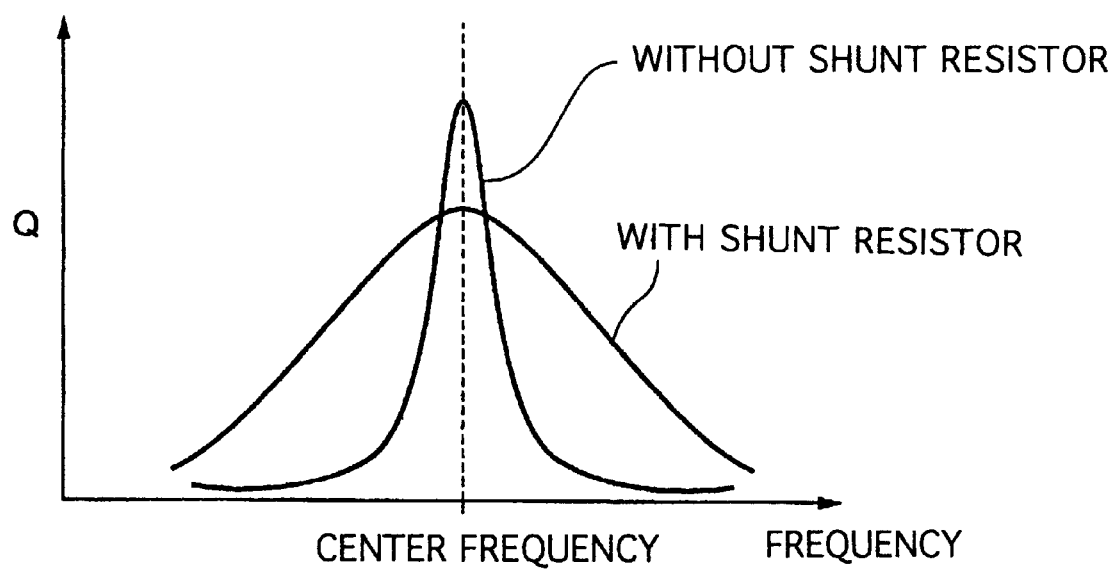
FIG. 7 is a diagram comparatively showing a Q characteristic of the millimeter wave modulator with and without a shunt resistor.

As can be seen from FIG. 7, when the PIN diode 11 is rapidly turned on and off without the shunt resistor 12, there equivalently appears an LC parallel resonance circuit. Consequently, the Q value increases and the bandwidth is narrowed. Using the shunt resistor 12, the Q value of the parallel resonance circuit of the PIN diode 11 and the shunt resistor 12 becomes reduced when viewed from the driver circuit 8. In consequence, the bandwidth can be widened without changing the resonance frequency (center frequency).

The resistance of the shunt resistor 12 may be appropriately determined according to characteristics of the PIN diode 11 (e.g., the values of L and C equivalently appearing in the PIN diode) and the switching speed so as to achieve the above function. For example, with a carrier frequency of 60 GHz and the resistance of the shunt resistor 12 ranging from 20 ohm to 50 ohm, it is possible to secure a modulation band of 312 MHz or more. Experiments have shown that a modulation band exceeding 300 MHz is achieved with the carrier frequency ranging from 38 GHz to 60 GHz.

Consequently, in accordance with the above configuration under the direct modulation technology, there can be implemented a wide band, millimeter wave, digital communication. It is possible to cope with various digital encoding systems such as the CMI, the Manchester code, NRZ, and RZ systems.

Figure 8:
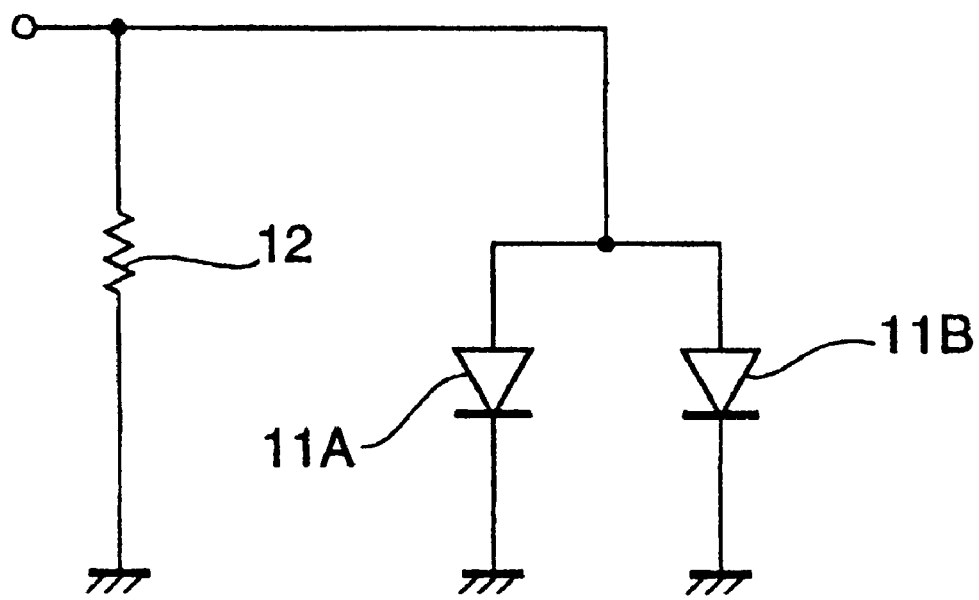
FIG. 8 is a circuit diagram showing a variation of a millimeter wave modulator.
Figure 9:
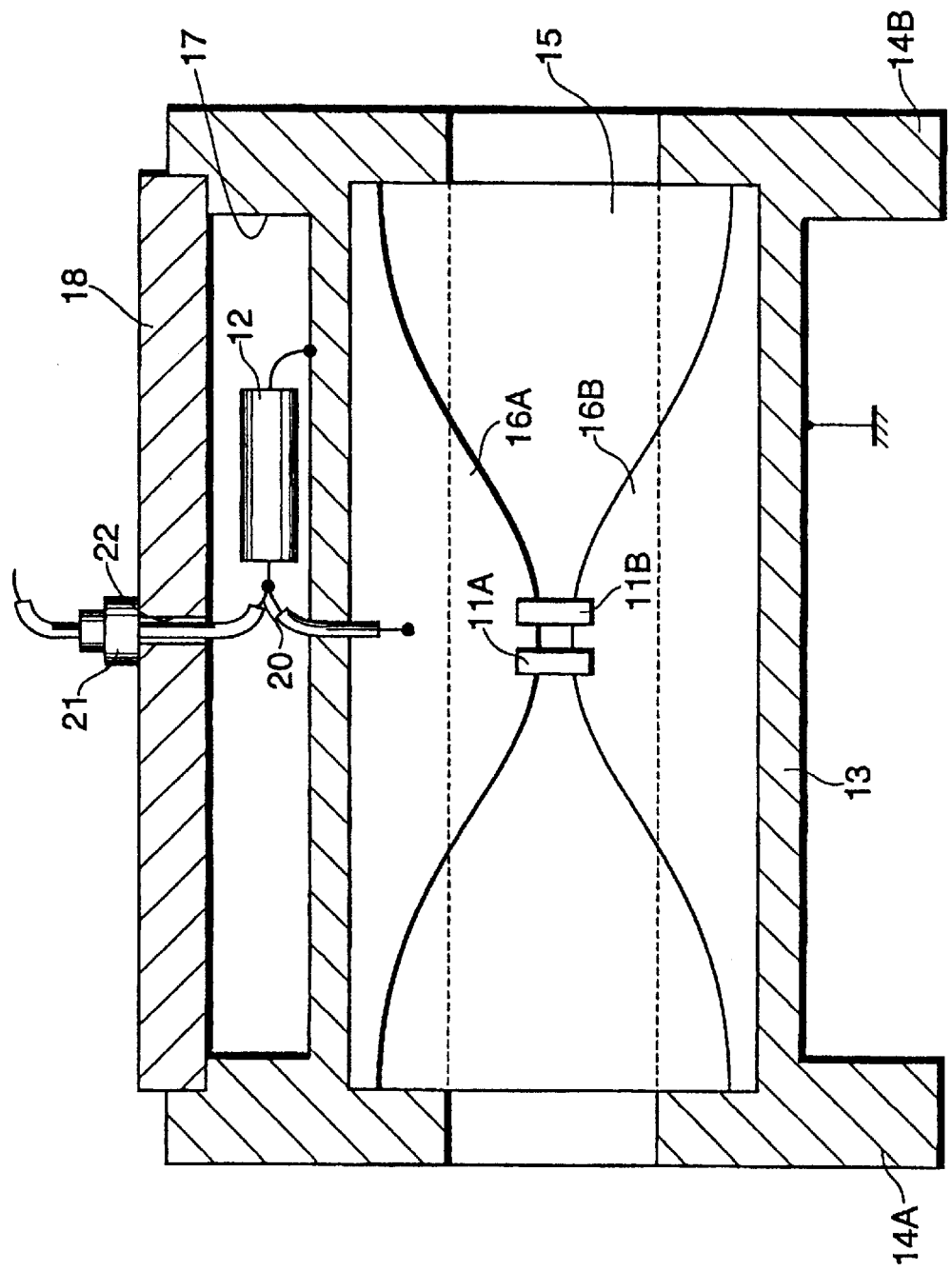
FIG. 9 is a longitudinal cross-sectional view of a variation of a millimeter wave modulator.

As shown in FIGS. 8 and 9, two or more PIN diodes 11A and 11B may be arranged in a parallel connection depending on cases. The quantity of carriers passing through the waveguide when the PIN diode is on can be much more different from that of carriers slightly leaking therefrom when the PIN diode is off. In either case, the number of is PIN diodes may be determined according to the performance of the PIN diodes.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A millimeter wave modulator including a millimeter wave waveguide and a switching element disposed in the waveguide in which the switching element is turned on and off by a signal to achieve amplitude-modulation of a millimeter carrier wave propagating through the waveguide, further including a resistor connected to the switching element in parallel.

2. A millimeter wave modulator in accordance with claim 1, wherein:

the resistor has resistance which is sufficiently greater than resistance of the switching element when the switching element is on and is sufficiently smaller than resistance of the switching element when the switching element is off.

3. A millimeter wave modulator in accordance with claim 1, further including a plurality of switching elements connected in parallel to each other.

4. A method of achieving direct modulation of a millimeter carrier wave in a waveguide, comprising the steps of:

disposing a switching element in the waveguide and causing the switching element to be turned on and off by a signal to change impedance of the millimeter carrier wave propagating through the waveguide; and connecting a resistor to the switching element in parallel thereby reducing a Q value of a parallel resonance circuit appearing when the switching element is switched at a high speed to broaden a modulation bandwidth.

5. A millimeter wave transmitter, comprising:

an oscillator for generating a millimeter carrier wave;

a waveguide for guiding a millimeter wave from the oscillator to an antenna;

a switching element disposed in the waveguide, the switching element being turned on and off by a signal; and a resistor connected to the switching element in parallel.

6. A device for performing a high-speed switching operation, comprising:

a waveguide;

a substrate disposed in the waveguide, the substrate being used to arrange a switching element thereon;

a conductor pattern fabricated on the substrate for achieving impedance matching in a section of the waveguide between an input side thereof and a position at which the switching element is arranged and in a section of the waveguide between an output side thereof and the position of the switching element; and a resistor connected to the switching element in parallel.

* * * * *